US012796325B2

(12) United States Patent
Bhandari

(10) Patent No.: US 12,796,325 B2
(45) Date of Patent: Nov. 10, 2026

(54) THERMOELECTRIC POWER SYSTEM

(71) Applicant: THE BOEING COMPANY, Arlington, VA (US)

(72) Inventor: Saksham Bhandari, St Charles, MO (US)

(73) Assignee: THE BOEING COMPANY, Arlington, VA (US)

( * ) Notice: Subject to any disclaimer, the term of this patent is extended or adjusted under 35 U.S.C. 154(b) by 0 days.

(21) Appl. No.: 18/796,164

(22) Filed: Aug. 6, 2024

(65) Prior Publication Data

US 2026/0052904 A1 Feb. 19, 2026

(51) Int. Cl.
*B64D 27/357* (2024.01)
*B64D 27/32* (2024.01)
*H10N 10/17* (2023.01)

(52) U.S. Cl.
CPC ............ *H10N 10/17* (2023.02); *B64D 27/32* (2024.01); *B64D 27/357* (2024.01)

(58) Field of Classification Search
None
See application file for complete search history.

(56) References Cited

U.S. PATENT DOCUMENTS

2013/0298956 A1* 11/2013 Hiller ..................... H10N 10/13
136/212
2018/0231420 A1* 8/2018 Saitou .................. G01J 5/0813

FOREIGN PATENT DOCUMENTS

CN 118412980 A * 7/2024 ............ H10N 10/13
GB 2447333 A * 9/2008 ............ H10N 10/00

* cited by examiner

*Primary Examiner* — Dustin Q Dam
(74) *Attorney, Agent, or Firm* — Moore IP Law

(57) ABSTRACT

The present disclosure provides a thermoelectric power system including one or more thermoelectric power devices for generating power. An example thermoelectric power device includes a thermoelectric generator, a first plate, and a second plate. A first side of the thermoelectric generator is at a higher temperature than a second, opposite, side of the thermoelectric generator. The first plate is disposed on the first side of the thermoelectric generator and includes a first surface coating that affects a heat absorption of the first plate. The second plate is disposed on the second side of the thermoelectric generator and includes a second surface coating that affects a heat absorption of the second plate.

20 Claims, 12 Drawing Sheets

THERMOELECTRIC POWER SYSTEM

FIELD

The present disclosure relates to power generation. More specifically, the present disclosure relates to a thermoelectric power system including one or more thermoelectric power devices for generating power.

BACKGROUND

Electrical propulsion for flight and electrical power for inflight activities consume vast amounts of energy. Traditionally, aviation has relied on battery systems for electrical propulsion and in-flight power. However, the range and capabilities of electric aircraft are limited by battery capacity and limitations on the ability to generate electricity during flight.

SUMMARY

Certain aspects of the present disclosure provide a thermoelectric power device. The thermoelectric power device includes a thermoelectric generator. A first side of the thermoelectric generator is at a higher temperature than a second, opposite, side of the thermoelectric generator. The thermoelectric power device also includes a first plate disposed on the first side of the thermoelectric generator. The first plate includes a first surface coating that affects a heat absorption of the first plate. The thermoelectric power device also includes a second plate disposed on the second side of the thermoelectric generator. The second plate includes a second surface coating that affects a heat absorption of the second plate.

Certain aspects of the present disclosure provide a thermoelectric power system. The thermoelectric power system includes an energy storage unit and one or more thermoelectric power devices coupled to the energy storage unit and configured to provide power to the energy storage unit. Each of the one or more thermoelectric power devices includes a thermoelectric generator, a first plate disposed on a first side of the thermoelectric generator, and a second plate disposed on a second, opposite, side of the thermoelectric generator. The first side of the thermoelectric generator is at a higher temperature than the second, opposite, side of the thermoelectric generator. The first plate includes a first surface coating that affects a heat absorption of the first plate. The second plate includes a second surface coating that affects a heat absorption of the second plate.

Certain aspects of the present disclosure provide an aircraft. The aircraft includes a thermoelectric power system. The thermoelectric power system includes an energy storage unit. The thermoelectric power system also includes one or more thermoelectric power devices coupled to the energy storage unit and configured to provide power to the energy storage unit. Each of the one or more thermoelectric power devices includes: a thermoelectric generator, wherein a first side of the thermoelectric generator is at a higher temperature than a second, opposite, side of the thermoelectric generator; a first plate disposed on the first side of the thermoelectric generator, the first plate including a first surface coating that affects a heat absorption of the first plate; and a second plate disposed on the second side of the thermoelectric generator, the second plate including a second surface coating that affects a heat absorption of the second plate. The thermoelectric power system further includes a power conditioning unit coupled between the energy storage unit and the one or more thermoelectric power devices.

BRIEF DESCRIPTION OF THE DRAWINGS

So that the manner in which the above recited features can be understood in detail, a more particular description, briefly summarized above, may be had by reference to example aspects, some of which are illustrated in the appended drawings. It is to be noted, however, that the appended drawings illustrate typical embodiments and are therefore not to be considered limiting; other equally effective embodiments are contemplated.

DETAILED DESCRIPTION

Figure 1A:
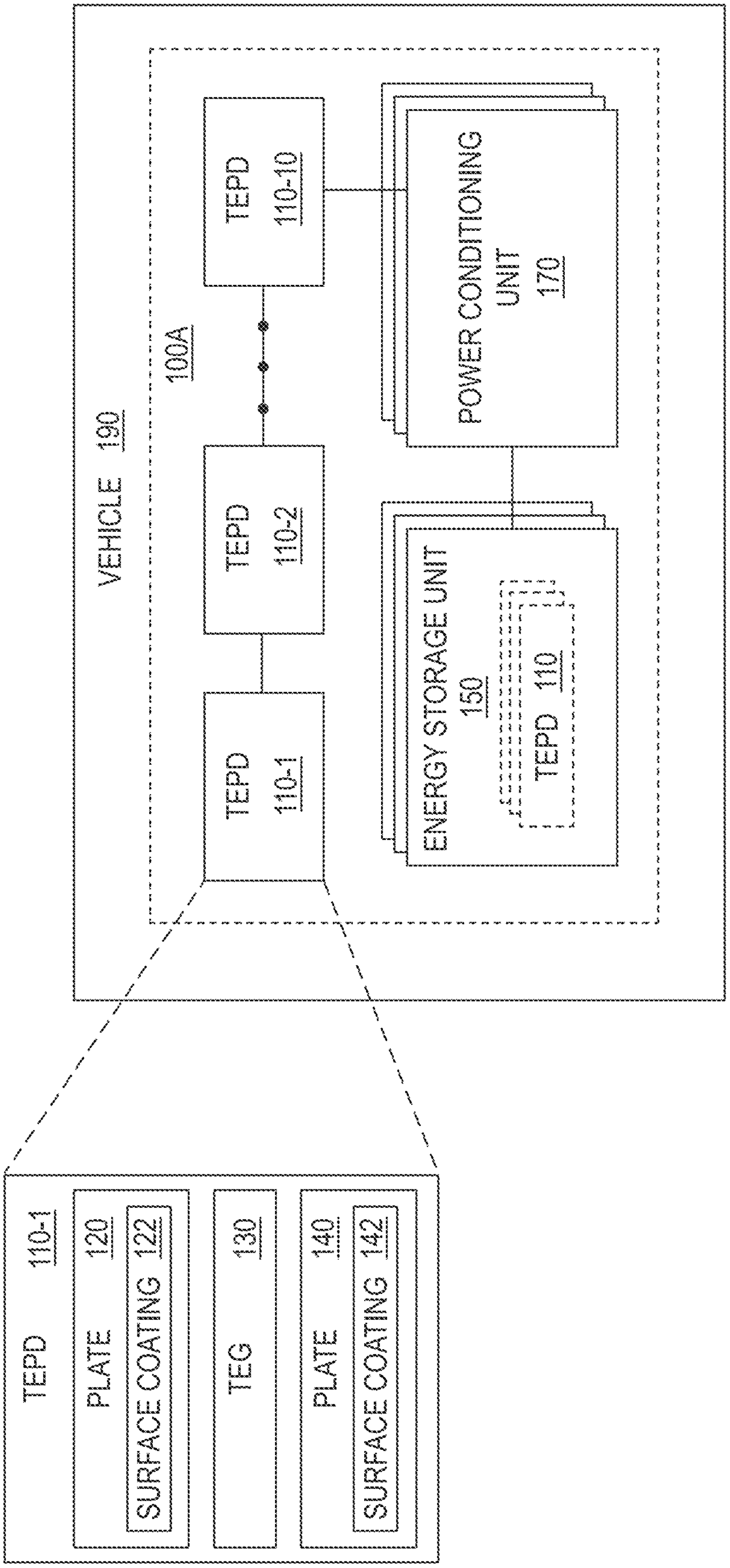
FIG. 1A depicts an example system, according to certain aspects of the present disclosure.

Aspects of the present disclosure provide a thermoelectric (or thermo-electric) power system including one or more thermoelectric power devices (TEPDs) for power generation. In certain aspects, the thermoelectric power system can be utilized to provide power to a variety of vehicles, such as aircraft, trains, automobiles, buses, unmanned aerial vehicles (UAVs) (e.g., drones), and boats, among others. As an illustrative, non-limiting, example, the thermoelectric power system can be implemented as part of an aircraft power generation system that generates and supplies power to one or more components and/or operations of the aircraft, including, for example, electrical propulsion and in-flight power.

In certain aspects, the TEPD (within a thermoelectric power system) has a specialized structure composed of a thermoelectric generator (TEG) and two plates disposed on opposite sides of the TEG. A TEG (also known as a Seebeck generator) is generally a solid state device that converts heat (driven by temperature differences) directly into electrical energy through a thermoelectric effect commonly known as the Seebeck effect. One of the two plates is attached to the "hot" side of the TEG and the other one of the two plates is attached to the "cold" side of the TEG. That is, the "hot" side of the TEG is at a higher temperature than the "cold" side of the TEG.

In certain aspects described herein, the plate attached to the "hot" side of the TEG is chromatically designed to efficiently absorb radiation (e.g., thermal radiation, solar radiation, etc.), while the plate attached to the "cold" side of the TEG is chromatically designed to efficiently reflect radiation. For example, the plate attached to the “hot” side of the TEG may be composed of one or more materials with a high electrical conductivity and a high thermal conductivity, and may include a surface coating having a high heat (or thermal energy) absorption. The plate attached to the “cold” side of the TEG may be composed of one or more materials with a high electrical conductivity and high thermal conductivity, and may include a surface coating having a low heat (or thermal energy) absorption. In this manner, each plate is specifically designed to conduct its respective level of thermal energy.

In certain aspects, the TEPD described herein can be deployed in any suitable location within a vehicle in order to provide power to one or more components and/or one or more operations of the vehicle. As an illustrative example, in an aviation scenario, the TEPD can leverage the TEG to convert temperature differentials in aviation air and space environments into electrical energy that can supplement aircraft battery systems, UAV battery systems, etc.

The TEPD and thermoelectric power system described herein may provide various technical advantages. For example, compared to conventional power generation systems, the thermoelectric power device and system can significantly increase the amount of energy extraction from ambient environmental conditions, thereby providing an efficient means of power generation. For example, dark-hued plates on the TEG’s hot side can harness radiation (e.g., thermal radiation, solar radiation, among others) with improved efficiency (relative to conventional TEGs), while contrasting plates on the cold side can efficiently dissipate heat to the surrounding atmosphere. Additionally, the weight of the thermoelectric power device and system may be significantly lower than existing systems. In this manner, the TEPD can reduce reliance on traditional power sources, extending aircraft range, and enhancing environmental sustainability.

Although the terms “first,” “second,” “third,” etc., may be used herein to describe various elements, components, regions, layers and/or sections, these elements, components, regions, layers and/or sections should not be limited by these terms. These terms may be only used to distinguish one element, component, region, layer or section from another element, component, region, layer, or section. Terms such as “first,” “second,” and other numerical terms, when used herein, do not imply a sequence or order unless clearly indicated by the context. Thus, a first element, component, region, layer, or section discussed herein could be termed a second element, component, region, layer, or section without departing from aspects of the present disclosure.

As used herein, a hyphenated form of a reference numeral refers to a specific instance of an element and the un-hyphenated form of the reference numeral refers to the collective element. Thus, for example, device “12-1” refers to an instance of a device class, which may be referred to collectively as devices “12” and any one of which may be referred to generically as a device “12.”

FIG. 1A depicts an example system 100A for generating power for a vehicle 190, according to certain aspects of the present disclosure. The vehicle 190 is generally representative of a variety of transport apparatus (or structures), such as aircraft, trains, automobiles, buses, UAVs (e.g., drones), and boats, as illustrative, non-limiting examples. In certain aspects, the vehicle 190 is an aircraft (e.g., airplane) that can use one or more (or a combination of) energy sources for propulsion and/or in-flight operations. For example, the aircraft may be an all-electric aircraft that uses electricity for propulsion and in-flight operations. In another example, the aircraft may be a hybrid-electric aircraft propulsion, utilizing a combination of jet-fuel (or other type of aviation fuel) and electricity for propulsion and/or in-flight operations. In certain aspects, the vehicle 190 is an UAV (e.g., drone) that can use one or more (or a combination of) energy sources for propulsion and/or in-flight operations.

In certain aspects, the system 100A is deployed within the vehicle 190 and may be configured to provide supplemental power for the vehicle’s power generation system. As shown, the system 100A includes, without limitation, one or more TEPDs 110-1 to 110-10, one or more power conditioning units 170, and one or more energy storage units 150. The power conditioning unit(s) 170 is coupled between the TEPDs 110 and the energy storage unit(s) 150. The power conditioning unit(s) 170 is generally configured to regulate incoming voltage (e.g., surge protection, prevent voltage fluctuations, filtering, remove electrical interference, etc.) from the TEPDs 110 to the energy storage unit(s) 150 and improve the quality of power that is delivered to the energy storage unit(s) 150 (e.g., power factor correction, noise suppression, transient impulse protection, buck/boost conversion, etc.). An illustrative, non-limiting, example of a power conditioning unit 170 is a voltage regulator. The energy storage unit(s) 150 is generally representative of an energy storage system for electricity generation. In certain illustrative examples, the energy storage unit 150 may be implemented with one or more batteries (each including an anode, cathode, an electrolyte, for example).

Figure 1B:
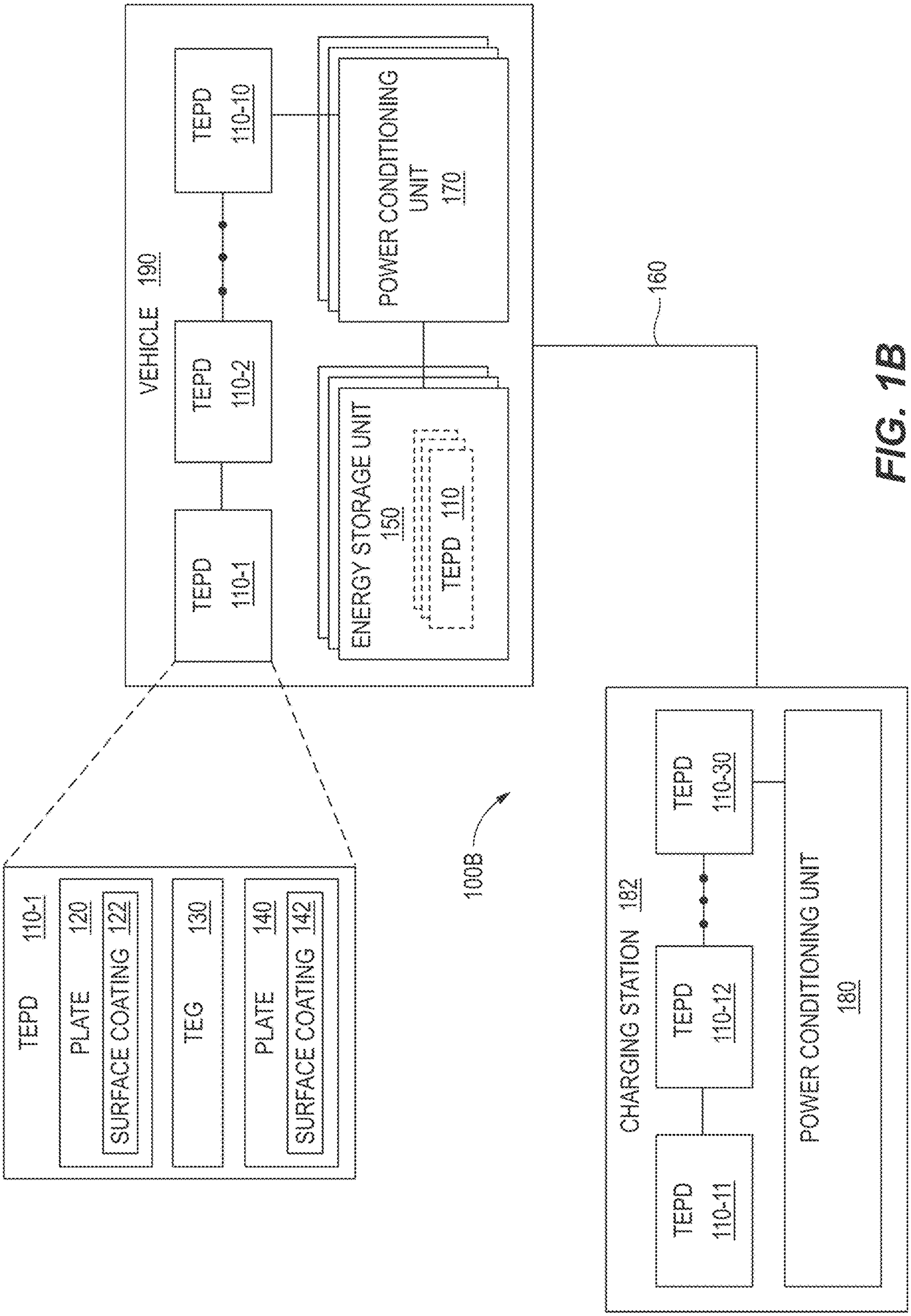
FIG. 1B depicts another example system, according to certain aspects of the present disclosure.
Figure 2:
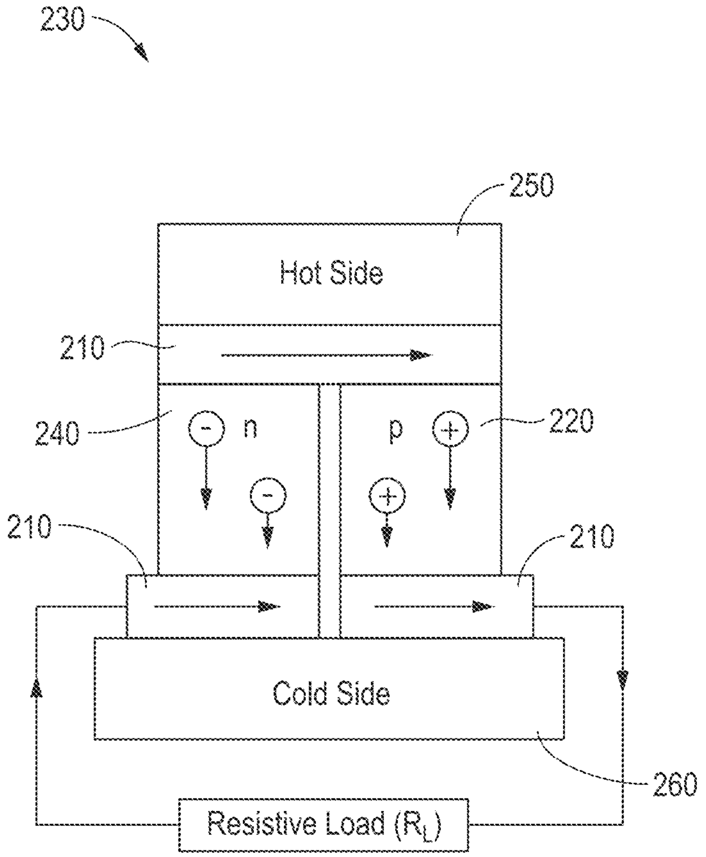
FIG. 2 depicts an example thermoelectric generator, according to certain aspects of the present disclosure.

Each TEPD 110 is generally configured to provide (supplemental) power to the energy storage unit 150. For example, each TEPD 110 includes a TEG 130, which is a solid state device that converts heat (driven by temperature differences) directly into electrical energy through a thermoelectric effect commonly known as the Seebeck effect. By way of example, FIG. 2 depicts an example configuration of a TEG 230, according to certain aspects of the present disclosure. Note the TEG 230 may be an illustrative implementation of the TEG 130 depicted in FIGS. 1A and 1B.

TEG 230 includes p-type and n-type thermoelectric elements 220, 240 (e.g., p-type and n-type semiconductors) that are connected in series with metal electrodes 210. While a certain number of thermoelectric elements 220, 240 are depicted in FIG. 2, note that the TEG 230 may include any number of thermoelectric elements 220, 240. The TEG 230 includes a substrate 250 and a substrate 260. When the substrate 250 is exposed to a heat source (e.g., “hot” side) and the substrate 260 is exposed to a heat sink (e.g., “cold” side), a temperature difference is created across the TEG 230, causing a current to flow through the circuit. The current can be used to power an external load (e.g., resistive load ($R_L$)) or charge a battery, such as energy storage unit 150. The voltage and power output of a TEG (e.g., TEG 230) may be based at least in part on the number of thermoelectric elements, the temperature difference, the Seebeck coefficient, and the electrical and thermal resistances of the thermoelectric elements.

Referring back to FIG. 1A, in certain aspects, in addition to a TEG 130, each TEPD 110 includes a plate 120 disposed (or attached) adjacent to the “hot” side of the TEG 130 and a plate 140 disposed (or attached) adjacent to the “cold” side of the TEG 130. The “hot” side of the TEG 130 is at a higher temperature than the “cold” side of the “cold” side of the TEG 130. The plates 120, 140 may be composed of one or more materials having high electrical conductivity and high thermal conductivity, such as metals (e.g., copper, aluminum, alloys thereof, etc.), ceramics (e.g., aluminum nitride), and graphite, as illustrative, non-limiting examples.

In certain aspects, the plate 120 disposed adjacent to the "hot" side of the TEG 130 is chromatically designed to attract radiation, and the plate 140 disposed adjacent to the "cold" side of the TEG 130 is chromatically designed to reflect radiation. For example, in certain aspects, the plate 120 may include a surface coating 122 and the plate 140 may include a surface coating 142. The surface coatings 122 and 142 may impact the heat absorption (or thermal energy absorption) of the plates 120 and 140, respectively. For example, the surface coating 122 may have a dark-hued color (e.g., black) and the surface coating 142 may have a light-hued color (e.g., white), such that the heat absorption of the plate 120 is greater than the heat absorption of the plate 140. In another example, the color of the surface coating 122 may have a lower light reflective value (LRV) than the color of the surface coating 142. For instance, the LRV of the color of the surface coating 122 may be 0% (e.g., a lowest LRV generally associated with a "pure black" color) (or relatively near 0% associated with dark-hued colors), whereas the LRV of the color of the surface coating 142 may be 100% (e.g., a maximum LRV generally associated with a "pure white" color) (or relatively near 100% associated with light colors). In certain aspects, to form the surface coating 122 and 142 on the plates 120 and 140, respectively, the plates 120 and 140 may be varnished and painted (e.g., coated) with a respective color to impact the respective heat absorptions of the plates. In certain aspects, the absorption of radiation on a given surface area of the plates 120, 140 may be represented using the following:

$$S = A^{*}e^{*}1360 \quad (1)$$

where S is the amount of absorbed radiation and has units of watts (or Joules per second (J/s)), A is surface area, and e is emissivity (e.g., how much an object absorbs vs. reflects light). In general, materials with higher e values include black paint and carbon-based materials, as illustrative examples, and materials with lower e values include white or silver paint, mirror, and aluminum foil, as illustrative examples.

In certain aspects, the plates 120, 140 may have different configurations to allow for seamless integration into the architecture of an aircraft while also enabling efficient absorption of radiation and efficient heat dissipation in an aviation environment. For example, in certain aspects, the height of the plate 120 may be greater than the height of the plate 140 and/or greater than a height of the TEG 130. As described in greater detail below, configuring the plate 120 with a greater height than the plate 140 and/or TEG 130 may allow for the TEPD 110 to improve the heat absorption efficiency of the TEG 130 when the TEPD 110 is disposed in certain locations (e.g., window system, cockpit, battery, etc.) within the architecture of an aircraft.

With the plates 120, 140 and the TEG 130, the TEPD 110 is generally configured to convert a temperature differential across the plates 120, 140 into electrical energy (e.g., current) that can be used to charge the energy storage unit(s) 150 of the vehicle 190. As depicted in FIG. 1A, one or more TEPDs 110-1 to 110-10 may be electrically connected in series to generate a desired (or target) amount of electrical energy. The electrical energy output from the series configuration of the TEPDs 110-1 to 110-10 may be provided to the energy storage unit(s) 150 after being regulated (e.g., filtered, buck/boost converted, etc.) by the power conditioning unit(s) 170.

In certain aspects, the TEPDs 110 may be disposed in any suitable location within the vehicle 190 in order to generate electrical energy for charging the energy storage unit(s) 150. As described below, such locations may include a window location, a battery location, and a location within the exhaust or tailpipe of the vehicle, as illustrative, non-limiting examples. By way of example, in certain aspects, one or more TEPDs 110 may be disposed on the surface(s) of one or more energy storage unit(s) 150, as depicted in FIG. 1A. The TEPDs 110 disposed on the energy storage unit(s) 150 may be used in addition to or as an alternative to the TEPDs 110-1 to 110-10 within the vehicle 190.

Note that FIG. 1A depicts an illustrative example configuration of a system for generating power for a vehicle 190 and that other system configurations consistent with the functionality described herein can be used for generating power for a vehicle 190. By way of example, FIG. 1B depicts another configuration of a system 100B for generating power for a vehicle 190, according to certain aspects of the present disclosure. Compared to the system 100A depicted in FIG. 1A, the system 100B includes a charging station 182. In certain aspects, the charging station 182 may be used to (re)-charge one or more energy storage units 150 of the vehicle 190, e.g., while the vehicle is parked or otherwise idle. For example, in scenarios where the vehicle 190 is an electric/hybrid aircraft, the charging station 182 may be positioned on a tarmac and used to re-charge the electric/hybrid aircraft.

As shown, the charging station 182 includes one or more TEPDs 110-11 to 110-30 and a power conditioning unit 180. The TEPDs 110-11 to 110-30 are electrically coupled in series and may provide electrical energy to the power conditioning unit 180. The power conditioning unit 180 may regulate the electrical energy before providing the energy to the vehicle 190 via the cable 160. The power conditioning unit 180 may be similar to the power conditioning unit 170 described with respect to FIG. 1A.

While FIGS. 1A and 1B depict the systems 100A and 100B with a certain number of TEPDs 110, a certain number of energy storage units 150, and a certain number of power conditioning units 170, note that the systems described herein can be implemented with any number of TEPDs 110, any number of energy storage units 150, and any number of power conditioning units 170.

Figure 3A:
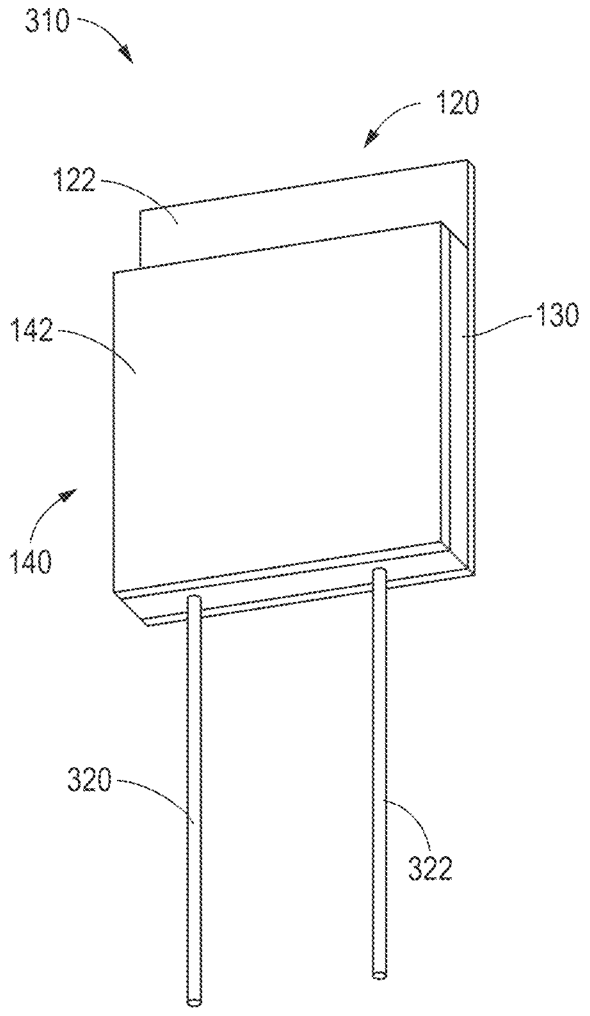
FIG. 3A depicts a perspective view of a thermoelectric power device, according to certain aspects of the present disclosure.
Figure 3B:
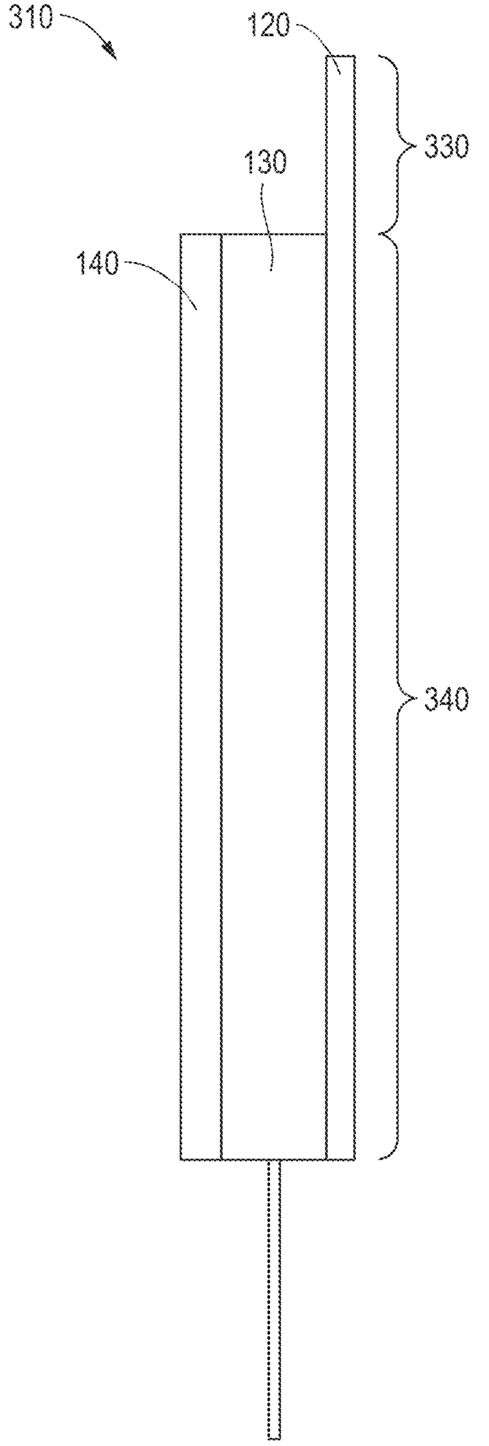
FIG. 3B depicts a side view of a thermoelectric power device, according to certain aspects of the present disclosure.

FIGS. 3A and 3B depict different views of an example TEPD 310, according to certain aspects of the present disclosure. In particular, FIG. 3A shows a perspective view of the TEPD 310 and FIG. 3B shows a side view of the TEPD 310, according to certain aspects of the present disclosure. TEPD 310 may be an illustrative example of the TEPD 110 described with respect to FIGS. 1A and 1B.

As shown, the TEPD 310 includes a TEG 130, a plate 120, and a plate 140. The plate 120 has a portion 340 attached to a "hot" side of the TEG 130 and has a portion 330 that extends above the TEG 130 and plate 140. The plate 140 is attached to a "cold" side of the TEG 130. As also shown, the plate 120 has a surface coating 122 with a dark-hued color, such as the color black, and the plate 140 has a surface coating 142 with a light color, such as the color white. Note, however, that the colors white and black are illustrative examples of colors that can be used for the surface coatings 122, 142, and that the surface coatings 122, 142 can have different colors. The TEPD 310 includes terminals 320, 322 for coupling to another component (e.g., power conditioning unit 170) and/or another TEPD 310.

As noted, the configuration of the TEPD, such as TEPD 310, may allow for the TEPD to be seamlessly integrated within the structure of an aircraft while also allowing for the TEPD to have efficient absorption of radiation and efficient heat dissipation in an aviation environment. By way of example, consider the workflow 400 in FIG. 4 illustrating a scenario for utilizing a TEPD (e.g., TEPD 310) within an aircraft, according to certain aspects of the present disclosure.

Figure 4:
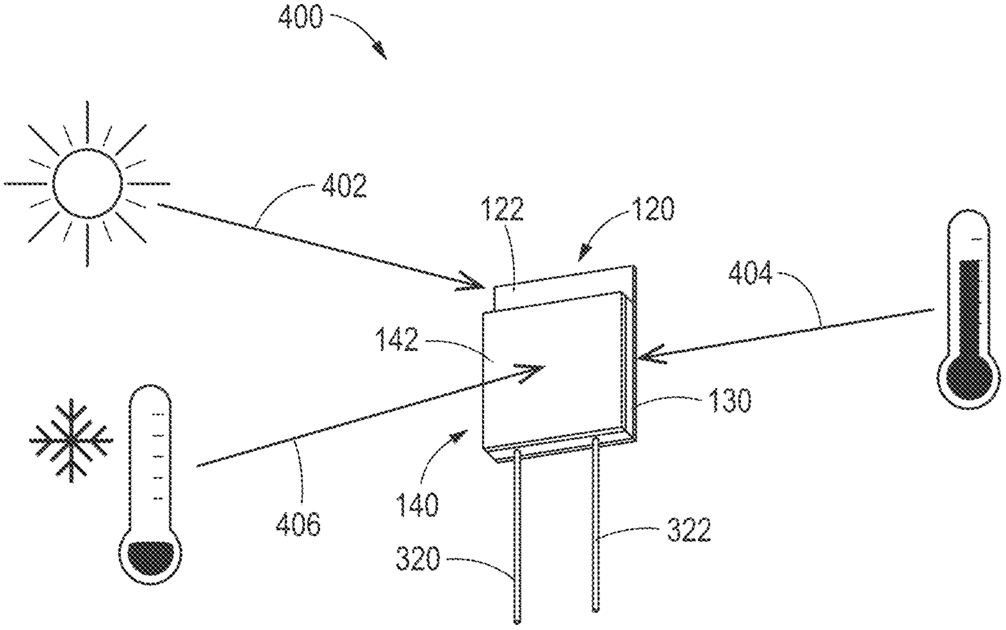
FIG. 4 further depicts an example workflow for generating power using a thermoelectric power device, according to certain aspects of the present disclosure.

In workflow 400, the TEPD may be positioned within an aircraft (e.g., vehicle 190), such that (i) the portion 340 of a first surface of the plate 120 is disposed on the "hot" side of the TEG 130, (ii) the portion 330 of the first surface of the plate 120 faces an external environment (e.g., sun) of the aircraft and absorbs radiation from the external environment (represented by arrow 402 in FIG. 4), (iii) a second surface of the plate 120 faces an internal environment (e.g., cabin) of the aircraft and is affected by relatively warm ambient temperature of the internal environment (represented by arrow 404 in FIG. 4), (iv) a first surface of the plate 140 is disposed on the "cold" side of the TEG 130, and (v) a second surface of the plate 140 faces the external environment and is affected by the relatively cold outside air temperature of the external environment (represented by arrow 406 in FIG. 4).

Figure 5:
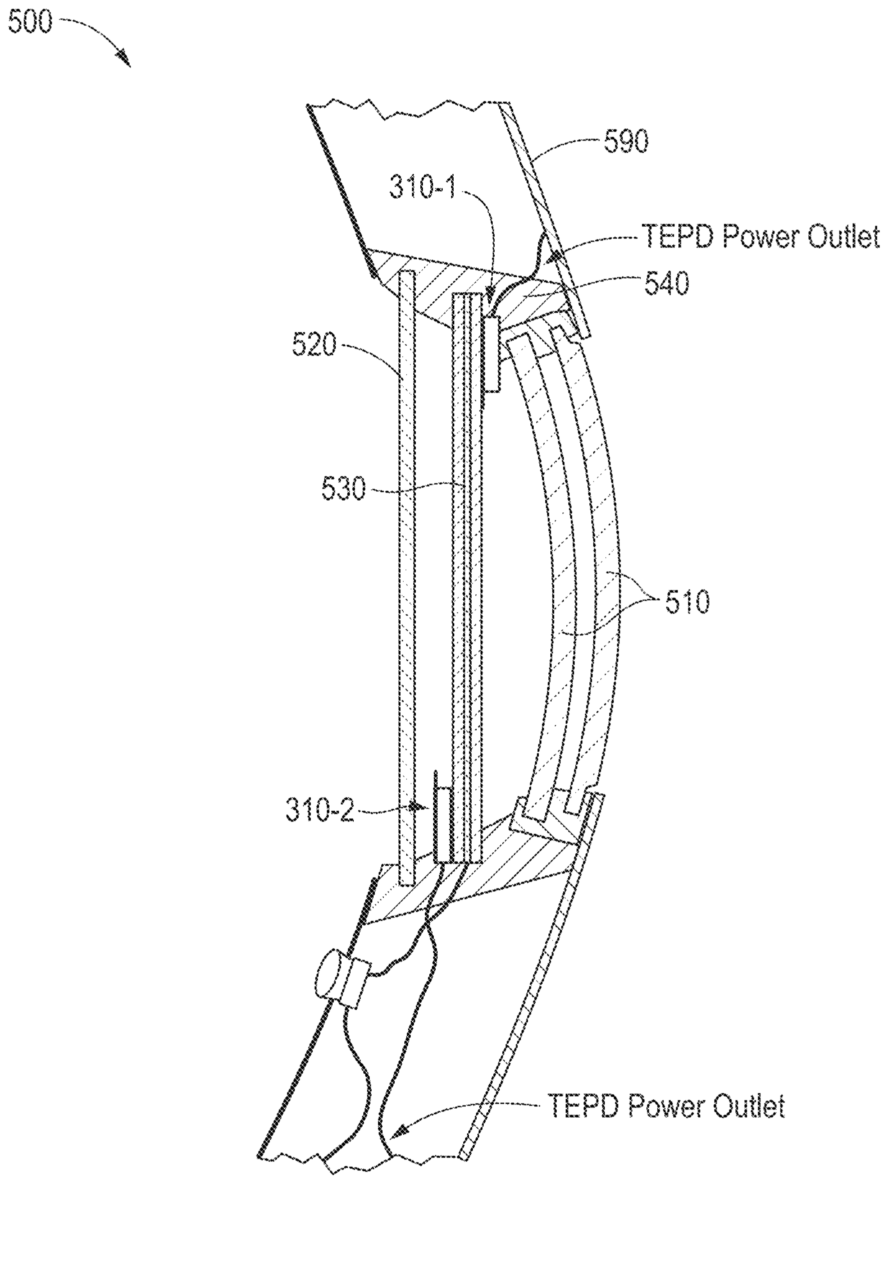
FIG. 5 depicts an example aircraft window system including one or more thermoelectric power devices, according to certain aspects of the present disclosure.

In certain aspects, the TEPD may operate according to the workflow 400 when the TEPD is positioned within a window of an aircraft (e.g., cabin window, cockpit window, etc.). By way of example, FIG. 5 depicts an aircraft window system 500 including one or more TEPDs 310-1 to 310-2, according to certain aspects of the present disclosure. As shown, the aircraft window system 500 includes a structural cabin window system 510 disposed between the interior reveal structure 540 of the aircraft 590, a dust cover 520, and an electrochromic panel 530 disposed between the dust cover 520 and the structural cabin window system 510.

As shown, the TEPD 310-1 and TEPD 310-2 may be disposed on opposite surfaces of the panel 530. With respect to TEPD 310-1, for example, (i) portion 340 of a first surface of plate 120 is disposed on the "hot" side of TEG 130 of TEPD 310-1, (ii) portion 330 of the first surface of plate 120 faces an external environment of the aircraft 590 and is affected by the external environment, (iii) a second surface of the plate 120 is disposed on a first surface of panel 530 and is affected by an internal environment of the aircraft 590, (iv) a first surface of the plate 140 is disposed on the "cold" side of the TEG 130 of TEPD 310-1, and (v) a second surface of the plate 140 faces the external environment and is affected by the external environment.

With respect to TEPD 310-2, for example, (i) portion 340 of a first surface of the plate 120 is disposed on the "hot" side of the TEG 130 of TEPD 310-2, (ii) portion 330 of the first surface of the plate 120 faces the external environment of the aircraft 590 and is affected by the external environment, (iii) a second surface of the plate 120 faces an internal environment of the aircraft 590 and is affected by the internal environment, (iv) a first surface of the plate 140 is disposed on the "cold" side of the TEG 130 of TEPD 310-2, and (v) a second surface of the plate 140 is disposed on a second surface of panel 530 and is affected by the external environment to the aircraft 590.

Note while FIG. 5 depicts the TEPDs 310-1 to 310-2 being disposed on a panel 530 within the aircraft window system 500, the TEPDs 310 may be positioned elsewhere within the aircraft window system 500, such as on (any surface of) the dust cover 520, as an illustrative example. In general, one or more TEPDs 310 can be positioned between the dust cover 520 and structural cabin window system 510 or in any location within the aircraft's interior reveal structure 540. In some aspects, placing the TEPDs 310 closer to the structural cabin window system 510 may increase the efficiency of the energy extraction (e.g., by increasing the temperature differential), thereby increasing the amount of power that is generated from the TEPDs 310.

Additionally, while FIGS. 3A-3B depict a TEPD in which plate 140 has a higher height than plate 120, note that the TEPD described herein is not limited to such a configuration and that other configurations of the TEPD are contemplated. For example, in certain aspects, the TEPD may include plates 120, 140 with a same height with respect to each other and/or with respect to the TEG. In general, the TEPD described herein may have any suitable form factor consistent with the functionality described herein for generating power. Note, however, in certain aspects, a TEPD in which the plate 120 has a larger surface area than plate 140 may allow for capturing more radiation, than configurations in which the plate 120 has a same surface area than plate 140.

Figure 6:
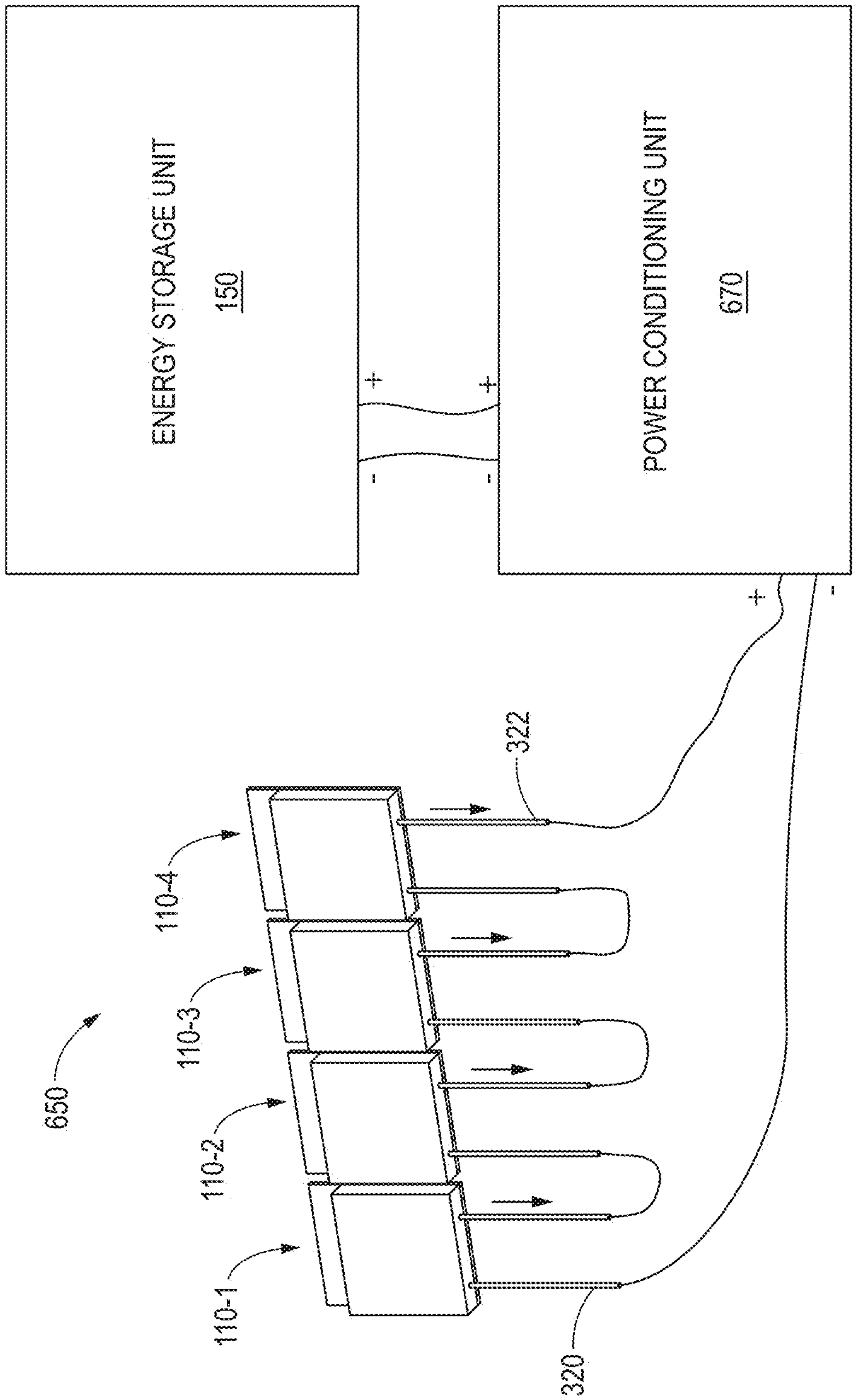
FIGS. 6-11 depict various example scenarios utilizing one or more thermoelectric power devices, according to certain aspects of the present disclosure.

As noted, in certain aspects, multiple TEPDs 110 may be electrically connected in series and used to generate power for charging one or more energy storage units 150. By way of example, FIG. 6 depicts an example scenario 600 utilizing a TEPD configuration 650 with multiple TEPDs 110, according to certain aspects of the present disclosure. In particular, the TEPD configuration 650 incudes TEPDs 110-1 to 110-4, which are electrically connected in series and used to generate power for charging the energy storage unit 150 via the power conditioning unit 670. The power conditioning unit 670 may be similar to the power conditioning unit 170 illustrated in FIGS. 1A and 1B or the power conditioning unit 180 illustrated in FIG. 1B.

As shown, a terminal 320 of TEPD 110-1 is coupled to the power conditioning unit 670, terminal 322 of TEPD 110-1 is coupled to terminal 320 of TEPD 110-2, terminal 322 of TEPD 110-2 is coupled to terminal 320 of TEPD 110-3, terminal 322 of TEPD 110-3 is coupled to terminal 320 of TEPD 110-4, and terminal 322 of TEPD 110-4 is coupled to the power conditioning unit 670. Although four TEPDs are depicted, note that any number of TEPDs may be used to provide power to the energy storage unit 150.

Figure 7:
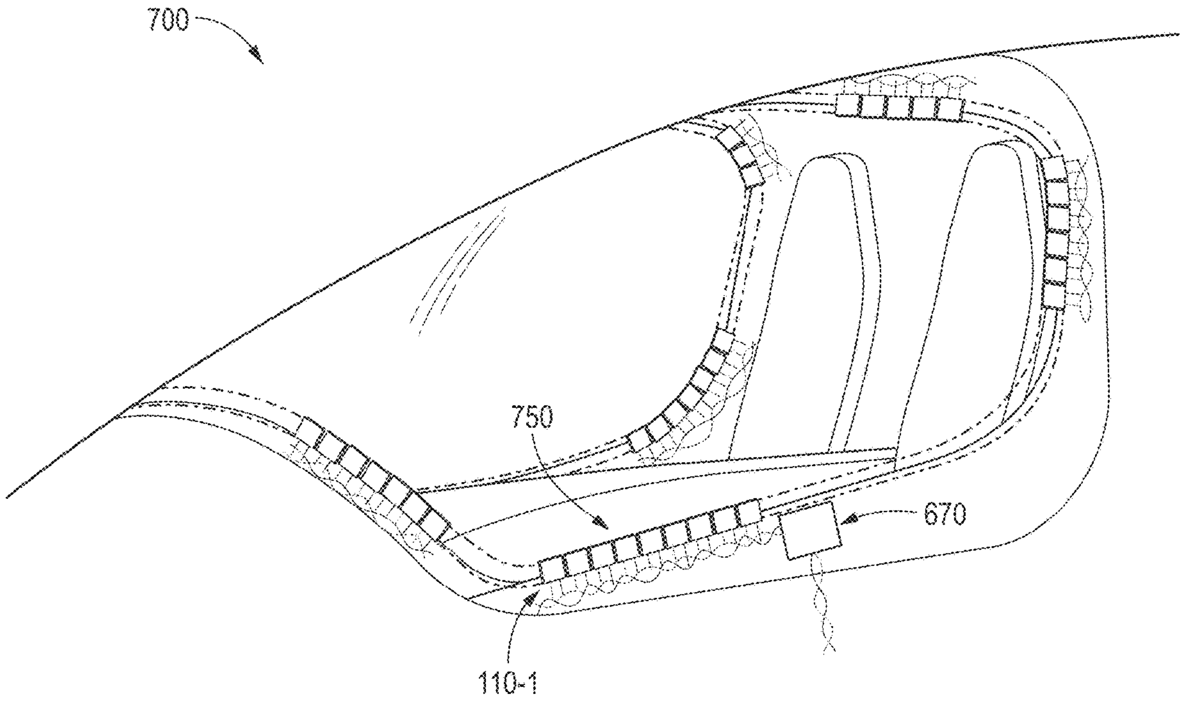
Figure 8:
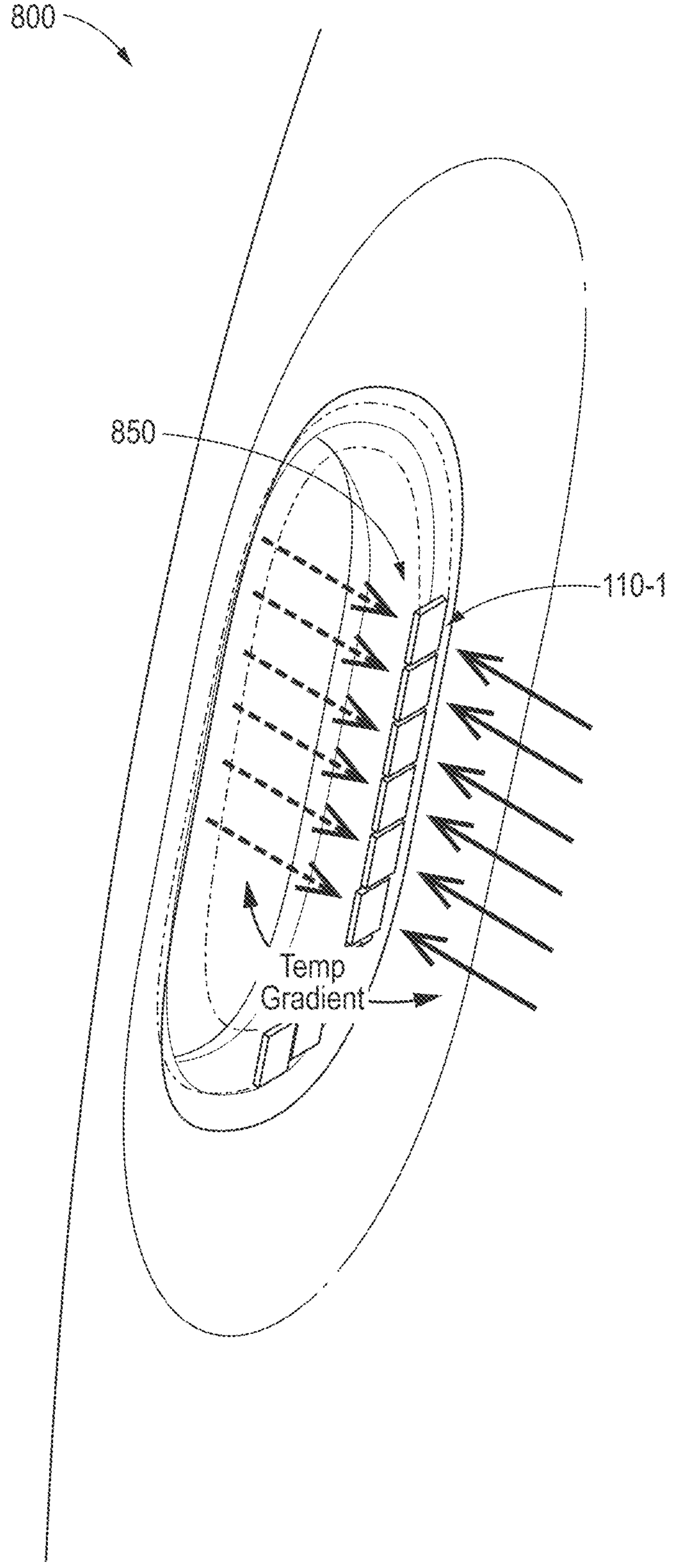

Similarly, a TEPD configuration (with one or more TEPDs) may be positioned within any suitable location within a vehicle 190, such as an aircraft, as an illustrative example. By way of example, FIG. 7 depicts an example scenario 700 in which a TEPD configuration 750 (with one or more TEPDs 110) is disposed within the cockpit window system of an aircraft 590, according to certain aspects of the present disclosure. By way of another example, FIG. 8 depicts an example scenario 800 in which a TEPD configuration 850 (with one or more TEPDs 110) is disposed within a cabin window system of an aircraft 590, according to certain aspects of the present disclosure.

Figure 9:
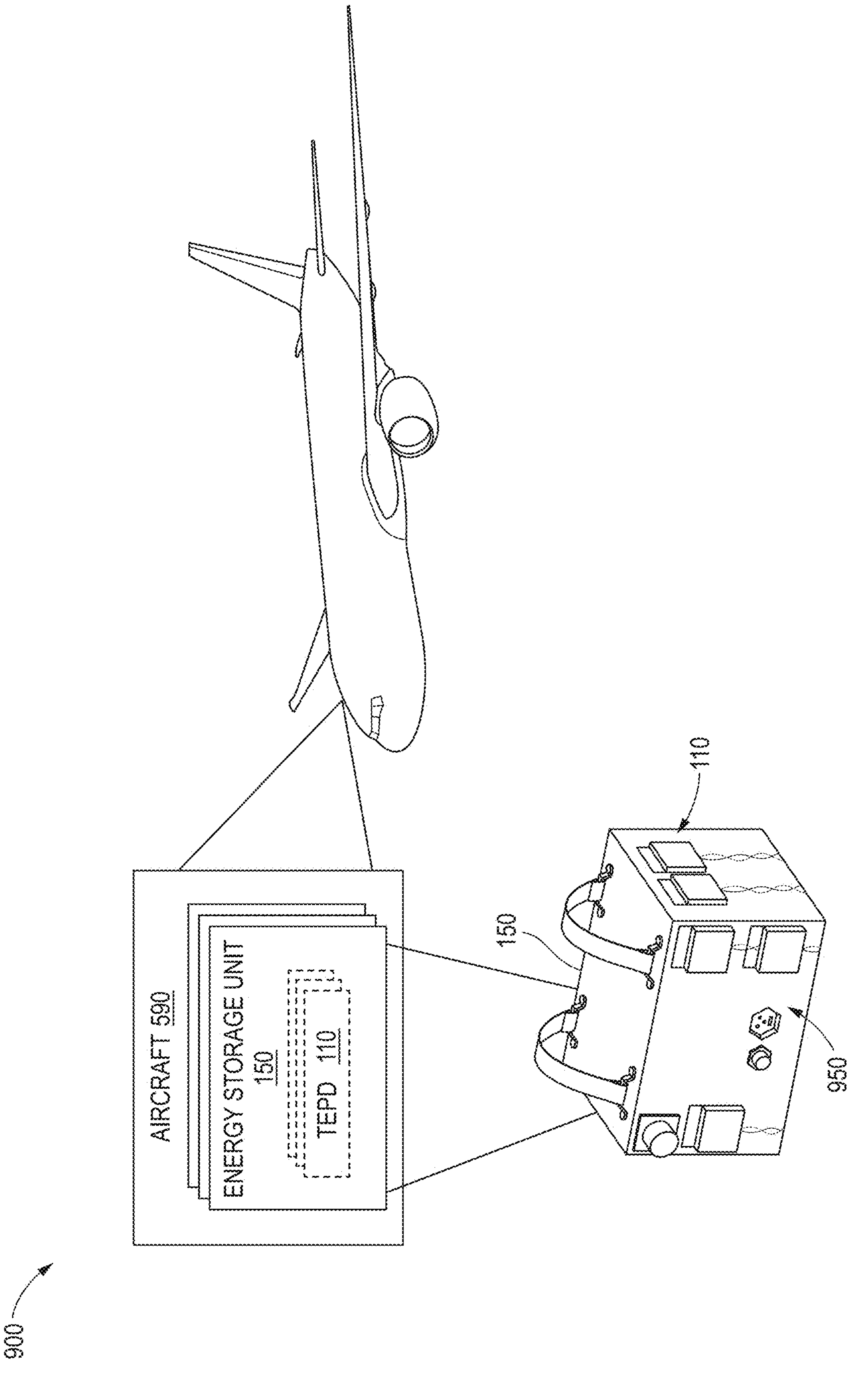

By way of another example, FIG. 9 depicts an example scenario 900 in which a TEPD configuration 950 (with one or more TEPDs 110) is disposed on one or more energy storage units 150 within an aircraft 590, according to certain aspects of the present disclosure. In scenario 900, each TEPD 110 may be positioned on the energy storage unit 150, such that the plate 120 of the TEPD 110 is disposed on the surface of the energy storage unit 150 and the plate 140 of the TEPD 110 is exposed to an internal environment of the aircraft 590.

Figure 10:
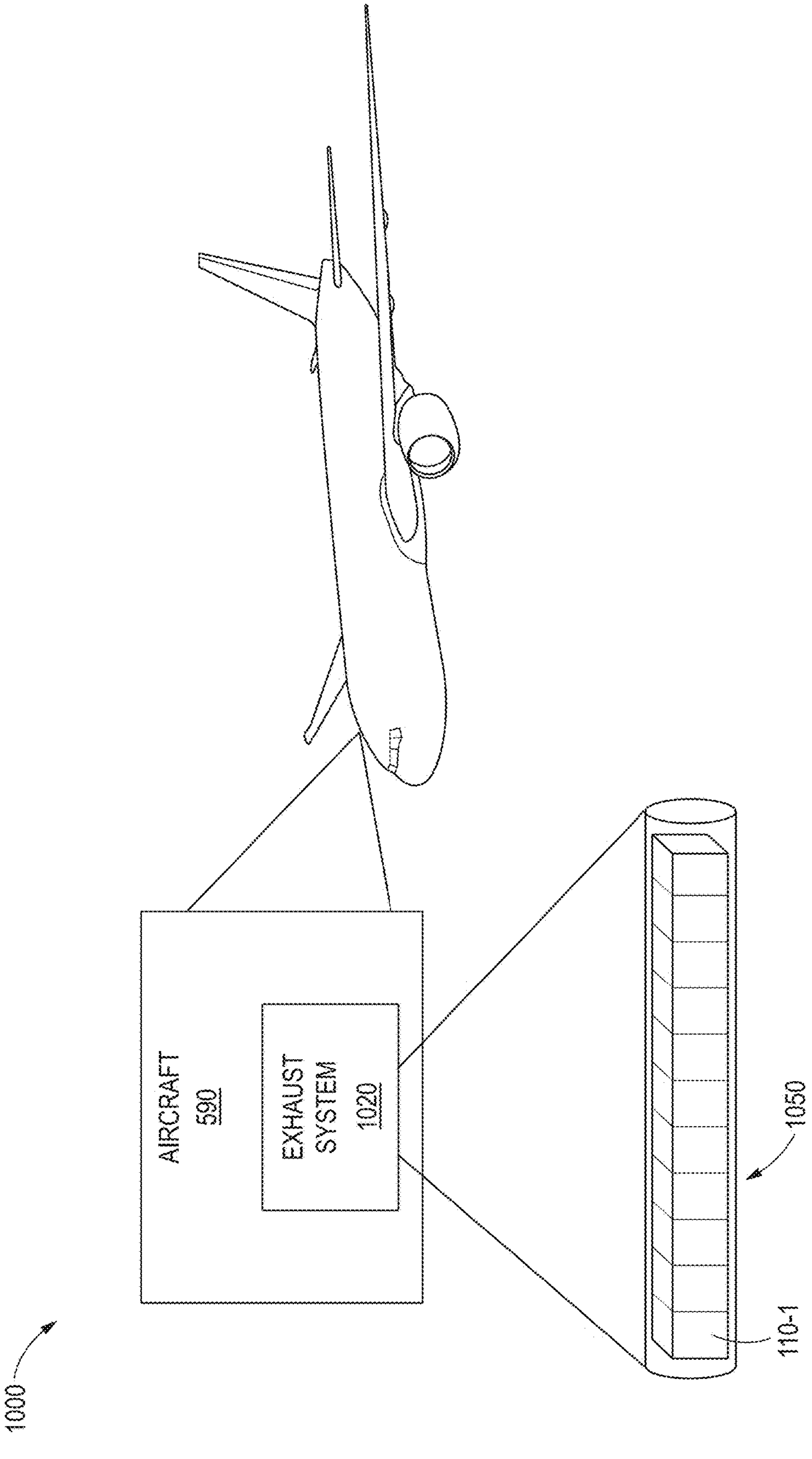

By way of another example, FIG. 10 depicts an example scenario 1000 in which a TEPD configuration 1050 (with one or more TEPDs 110) is disposed within an exhaust system 1020 of an aircraft 590, according to certain aspects of the present disclosure. In scenario 1000, the TEPD configuration 1050 may include a rectangular prism of TEPDs 110 (or a set of TEPDs in another form factor). In certain aspects, the exhaust (or a portion thereof) from the aircraft 590 may be fed into the TEPD configuration 1050 in order to generate power for the energy storage unit(s) 150.

Figure 11:
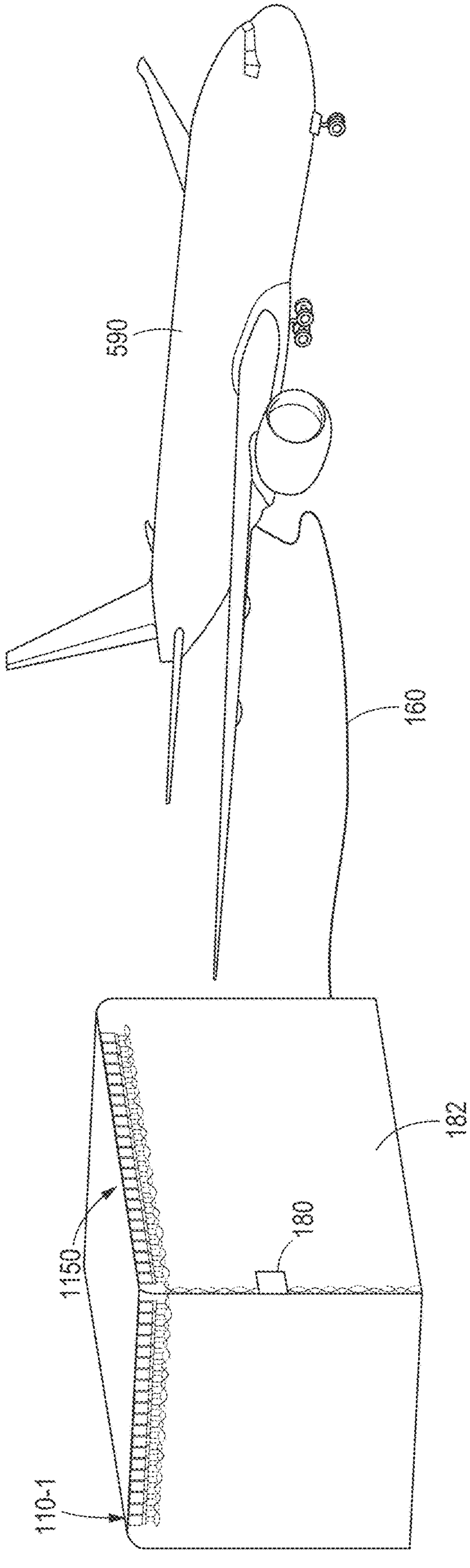

By way of another example, FIG. 11 depicts an example scenario 1100 in which a TEPD configuration 1150 (with one or more TEPDs 110) is disposed on the charging station 182, according to certain aspects of the present disclosure. In scenario 1100, each TEPD 110 may be positioned on the charging station 182, such that the plate 120 of the TEPD 110 is disposed on the surface of the charging station 182 and the plate 140 of the TEPD 110 is exposed to an ambient external environment.

Advantageously, the TEPD described herein has improved power generation performance and efficiency compared to conventional power generation systems. By maximizing energy extraction from ambient environmental conditions, the TEPD can reduce reliance on traditional power sources, extending aircraft range and enhancing environmental sustainability.

A further understanding of at least some of the aspects of the present disclosure is provided with reference to the following numbered Clauses, in which:

Clause 1: A thermoelectric power device comprising: a thermoelectric generator, wherein a first side of the thermoelectric generator is at a higher temperature than a second, opposite, side of the thermoelectric generator; a first plate disposed on the first side of the thermoelectric generator, the first plate comprising a first surface coating that affects a heat absorption of the first plate; and a second plate disposed on the second side of the thermoelectric generator, the second plate comprising a second surface coating that affects a heat absorption of the second plate.

Clause 2: The thermoelectric power device of Clause 1, wherein the heat absorption of the first plate is greater than the heat absorption of the second plate.

Clause 3: The thermoelectric power device of any of Clauses 1-2, wherein: the first surface coating has a first color; the second surface coating has a second color; and a light reflective value of the first color is lower than a light reflective value of the second color.

Clause 4: The thermoelectric power device of Clause 3, wherein the light reflective value of the first color is a lowest light reflective value and the light reflective value of the second color is a highest light reflective value.

Clause 5: The thermoelectric power device of any of Clauses 1-4, wherein a height of the first plate is at least one of (i) greater than or equal to a height of the second plate and (ii) greater than a height of the thermoelectric generator.

Clause 6: The thermoelectric power device of any of Clauses 1-5, wherein the thermoelectric generator is configured to convert a temperature differential across the first and second plates into electrical energy.

Clause 7: A thermoelectric power system comprising: an energy storage unit; and one or more thermoelectric power devices coupled to the energy storage unit and configured to provide power to the energy storage unit, wherein each of the one or more thermoelectric power devices comprises: a thermoelectric generator, wherein a first side of the thermoelectric generator is at a higher temperature than a second, opposite, side of the thermoelectric generator; a first plate disposed on the first side of the thermoelectric generator, the first plate comprising a first surface coating that affects a heat absorption of the first plate; and a second plate disposed on the second side of the thermoelectric generator, the second plate comprising a second surface coating that affects a heat absorption of the second plate.

Clause 8: The thermoelectric power system of Clause 7, wherein: the energy storage unit is located within an aircraft; and the one or more thermoelectric power devices are disposed within the aircraft.

Clause 9: The thermoelectric power system of Clause 7, wherein: the energy storage unit is located within an aircraft; and the one or more thermoelectric power devices are located external to the aircraft.

Clause 10: The thermoelectric power system of any of Clauses 7-9, wherein a thermoelectric power device of the one or more thermoelectric power devices is disposed on the energy storage unit.

Clause 11: The thermoelectric power system of Clause 10, wherein, for the thermoelectric power device, a first surface of the first plate is disposed on the first side of the thermoelectric generator and a second surface of the first plate is disposed on a surface of the energy storage unit.

Clause 12: The thermoelectric power system of Clause 11, wherein, for the thermoelectric power device, a first surface of the second plate is disposed on the second side of the thermoelectric generator and a second surface of the second plate is exposed to an internal environment within an aircraft.

Clause 13: The thermoelectric power system of Clause 11, wherein, for the thermoelectric power device, a first surface of the second plate is disposed on the second side of the thermoelectric generator and a second surface of the second plate is exposed to an external environment outside an aircraft.

Clause 14: The thermoelectric power system of any of Clauses 7-8, wherein the one or more thermoelectric power devices are positioned within a cabin window system of an aircraft.

Clause 15: The thermoelectric power system of Clause 14, wherein, for a thermoelectric power device of the one or more thermoelectric power devices: a first portion of a first surface of the first plate is disposed on the first side of the thermoelectric generator, a second portion of the first surface of the first plate faces an environment external to the aircraft and is affected by the environment external to the aircraft, and a second surface of the first plate faces an environment internal to the aircraft and is affected by the environment internal to the aircraft; and a first surface of the second plate is disposed on the second side of the thermoelectric generator and a second surface of the second plate faces the environment external to the aircraft and is affected by the environment external to the aircraft.

Clause 16: An aircraft comprising: a thermoelectric power system comprising: an energy storage unit; one or more thermoelectric power devices coupled to the energy storage unit and configured to provide power to the energy storage unit, wherein each of the one or more thermoelectric power devices comprises: a thermoelectric generator, wherein a first side of the thermoelectric generator is at a higher temperature than a second, opposite, side of the thermoelectric generator; a first plate disposed on the first side of the thermoelectric generator, the first plate comprising a first surface coating that affects a heat absorption of the first plate; and a second plate disposed on the second side of the thermoelectric generator, the second plate comprising a second surface coating that affects a heat absorption of the second plate; and a power conditioning unit coupled between the energy storage unit and the one or more thermoelectric power devices.

Clause 17: The aircraft of Clause 16, further comprising a plurality of cabin window systems for a plurality of cabin windows of the aircraft, wherein the one or more thermoelectric power devices are disposed within a cabin window system of the plurality of cabin window systems.

Clause 18: The aircraft of Clause 17, wherein, for a first thermoelectric power device of the one or more thermoelectric power devices: a first portion of a first surface of the first plate is disposed on the first side of the thermoelectric generator, a second portion of the first surface of the first plate faces an environment external to the aircraft and is affected by the environment external to the aircraft, and a second surface of the first plate is disposed on a first surface of a component of the cabin window system and is affected by an environment internal to the aircraft; and a first surface of the second plate is disposed on the second side of the thermoelectric generator, and a second surface of the second plate faces the environment external to the aircraft and is affected by the environment external to the aircraft.

Clause 19: The aircraft of Clause 18, wherein, for a second thermoelectric power device of the one or more thermoelectric power devices: a first portion of a first surface of the first plate is disposed on the first side of the thermoelectric generator, a second portion of the first surface of the first plate faces the environment external to the aircraft and is affected by the environment external to the aircraft, and a second surface of the first plate faces the environment internal to the aircraft and is affected by the environment internal to the aircraft; and a first surface of the second plate is disposed on the second side of the thermoelectric generator, and a second surface of the second plate is disposed on a second surface of the component of the cabin window system and is affected by the environment external to the aircraft.

Clause 20: The aircraft of any of Clauses 18-19, wherein the component of the cabin window system comprises a panel or a dust cover.

In the current disclosure, reference is made to various aspects. However, it should be understood that the present disclosure is not limited to specific described aspects. Instead, any combination of the following features and elements, whether related to different aspects or not, is contemplated to implement and practice the teachings provided herein. Additionally, when elements of the aspects are described in the form of "at least one of A and B," it will be understood that aspects including element A exclusively, including element B exclusively, and including element A and B are each contemplated. Furthermore, although some aspects may achieve advantages over other possible solutions and/or over the prior art, whether or not a particular advantage is achieved by a given aspect is not limiting of the present disclosure. Thus, the aspects, features, aspects and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, aspects described herein may be embodied as a system, method or computer program product. Accordingly, aspects may take the form of an entirely hardware aspect, an entirely software aspect (including firmware, resident software, micro-code, etc.) or an aspect combining software and hardware aspects that may all generally be referred to herein as a "circuit," "module" or "system."

While the foregoing is directed to aspects of the present disclosure, other and further aspects of the disclosure may be devised without departing from the basic scope thereof, and the scope thereof is determined by the claims that follow.

What is claimed is:

1. A thermoelectric power device comprising:

a thermoelectric generator having a first side opposite to a second side, wherein the first side of the thermoelectric generator is at a higher temperature than the second side of the thermoelectric generator during operation of the thermoelectric generator to generate electrical energy; and a first plate, wherein a first side of the first plate faces and is coupled to the first side of the thermoelectric generator, wherein a surface area of the first side of the first plate is greater than a surface area of the first side of the thermoelectric generator, wherein a portion of the first side of the first plate that extends past the first side of the thermoelectric generator comprises a first surface coating configured to facilitate radiative heat absorption at the portion of the first side of the first plate, and wherein a second side of the first plate is positioned on a surface of an electrochromic panel.

2. The thermoelectric power device of claim 1, further comprising a second plate, wherein a first side of the second plate is disposed on the second side of the thermoelectric generator, and wherein a surface area of the first side of the second plate is less than the surface area of the first side of the first plate.

3. The thermoelectric power device of claim 2, wherein a second side of the second plate opposite to the first side of the second plate comprises a surface coating configured to inhibit radiative heat absorption at the second side of the second plate.

4. The thermoelectric power device of claim 1, wherein a material of the first plate comprises a metal or graphite.

5. The thermoelectric power device of claim 1, wherein the electrochromic panel is coupled to a window of an aircraft, and wherein the second side of the thermoelectric generator faces an environment external to the aircraft.

6. The thermoelectric power device of claim 1, wherein the is electrically coupled in series to a second thermoelectric generator.

7. A thermoelectric power system comprising:

an electrochromic panel;

an energy storage unit; and one or more thermoelectric power devices, wherein the one or more thermoelectric power devices are coupled to the energy storage unit and configured to provide power to the energy storage unit, and wherein each of the one or more thermoelectric power devices comprises:

a thermoelectric generator having a first side opposite to a second side, wherein the first side of the thermoelectric generator is at a higher temperature than the second side of the thermoelectric generator during operation of the thermoelectric generator to generate electrical energy; and a first plate, wherein a first side of the first plate faces and is coupled to the first side of the thermoelectric generator, wherein a first surface area of the first side of the first plate is greater than a surface area of the first side of the thermoelectric generator, and wherein a portion of the first side of the first plate that extends past the first side of the thermoelectric generator comprises a first surface coating configured to facilitate radiative heat absorption at the portion of the first plate, wherein, for a particular thermoelectric power device of the one or more thermoelectric power devices, a second side of the first plate is positioned on a surface of the electrochromic panel.

8. The thermoelectric power system of claim 7, wherein:

the energy storage unit is located within an aircraft; and a particular thermoelectric power device of the one or more thermoelectric power devices is disposed within the aircraft.

9. The thermoelectric power system of claim 7, wherein:

the energy storage unit is located within an aircraft; and a particular thermoelectric power device of the one or more thermoelectric power devices is located external to the aircraft.

10. The thermoelectric power system of claim 7, wherein a particular thermoelectric power device of the one or more thermoelectric power devices is coupled to a cockpit window of an aircraft.

11. The thermoelectric power system of claim 10, wherein, for the particular thermoelectric power device, the portion faces an environment exterior to the aircraft.

12. The thermoelectric power system of claim 11, wherein, for the particular thermoelectric power device, a first surface of a second plate is coupled to a second side of the thermoelectric generator, and a second surface of the second plate opposite the first surface faces an aircraft window.

13. The thermoelectric power system of claim 7, wherein a at least one of the one or more thermoelectric power devices is coupled to a window of an aircraft.

14. The thermoelectric power system of claim 13, wherein the portion of the first side of the first plate faces an environment external to the aircraft.

15. The thermoelectric power system of claim 13, wherein the thermoelectric generator of the particular thermoelectric power device is electrically coupled in series to a second thermoelectric generator of a second thermoelectric device of the one or more thermoelectric power devices.

16. An aircraft comprising:

a thermoelectric power system comprising:

an electrochromic panel;

an energy storage unit;

one or more thermoelectric power devices, wherein the one or more thermoelectric power devices are coupled to the energy storage unit and configured to provide power to the energy storage unit, and wherein each of the one or more thermoelectric power devices comprises:

a thermoelectric generator having a first side opposite to a second side, wherein the first side of the thermoelectric generator is at a higher temperature than the second side of the thermoelectric generator during operation of the thermoelectric generator to generate electricity; and a first plate, wherein a first side of the first plate faces and is coupled to the first side of the thermoelectric generator, wherein a surface area of the first side of the first plate is greater than a surface area of the first side of the thermoelectric generator, and wherein a portion of the first side of the first plate that extends past the first side of the thermoelectric generator comprises a first surface coating configured to facilitate radiative heat absorption at the portion of the first side of the first plate, wherein a second side of the first plate of a particular thermoelectric power device of the one or more thermoelectric power devices is positioned on a surface of the electrochromic panel; and a power conditioning unit coupled between the energy storage unit and the one or more thermoelectric power devices.

17. The aircraft of claim 16, further comprising:

a plurality of cabin window systems for a plurality of cabin windows of the aircraft, wherein at least one of the one or more thermoelectric power devices is coupled to a cabin window system of the plurality of cabin window systems.

18. The aircraft of claim 17, wherein the portion of the particular a thermoelectric power device faces an environment external to the aircraft.

19. The aircraft of claim 18, wherein the second side of the first plate of the particular thermoelectric device faces an interior of the aircraft.

20. The aircraft of claim 19, wherein, for the particular thermoelectric power device, a first surface of a second plate is coupled to the second side of the thermoelectric generator, and wherein a second surface of the second plate opposite to the first surface of the second plate faces a surface of a cabin window system.

* * * * *